United States Patent
Drescher et al.

(10) Patent No.: US 7,958,404 B2
(45) Date of Patent: Jun. 7, 2011

(54) ENABLING RESYNCHRONIZATION OF A LOGIC ANALYZER

(75) Inventors: Keith Drescher, Olympia, WA (US); Debendra Das Sharma, Santa Clara, CA (US); David Sams, Columbia, SC (US); Richard Glass, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 255 days.

(21) Appl. No.: 12/414,733

(22) Filed: Mar. 31, 2009

(65) Prior Publication Data

US 2010/0251001 A1    Sep. 30, 2010

(51) Int. Cl.
*G06F 11/00*    (2006.01)
(52) U.S. Cl. .......................................................... 714/39
(58) Field of Classification Search ..................... 714/39
See application file for complete search history.

(56) References Cited

U.S. PATENT DOCUMENTS

| | | | |
|---|---|---|---|
| 6,009,488 A | 12/1999 | Kavipurapu | |
| 6,826,717 B1 * | 11/2004 | Draper et al. | 714/39 |
| 6,826,747 B1 * | 11/2004 | Augsburg et al. | 717/128 |
| 2003/0190922 A1 * | 10/2003 | Dalvi et al. | 455/502 |
| 2006/0294427 A1 | 12/2006 | Glass et al. | |
| 2007/0011534 A1 * | 1/2007 | Boudon et al. | 714/732 |
| 2007/0115831 A1 | 5/2007 | Sharma et al. | |
| 2008/0163034 A1 | 7/2008 | Tate et al. | |
| 2009/0323722 A1 * | 12/2009 | Sharma | 370/470 |

* cited by examiner

*Primary Examiner* — Michael C Maskulinski
(74) *Attorney, Agent, or Firm* — Trop, Pruner & Hu, P.C.

(57) ABSTRACT

In one embodiment, a state machine may enable retraining of a link, where the state machine is to be initiated responsive to an external input received from a logic analyzer coupled to the link or a periodic timer. Such external input may indicate that the logic analyzer has lost synchronization with respect to link communications, and the retraining thus enables the logic analyzer to regain resynchronization. Other embodiments are described and claimed.

20 Claims, 6 Drawing Sheets

ENABLING RESYNCHRONIZATION OF A LOGIC ANALYZER

BACKGROUND

Bus trace tools are an integral part of validation and debug of integrated circuits and systems formed using such components. These tools (generally referred to herein as trace tools or logic analyzers (LA)) observe a bus or link and are able to interpret and capture data transmitted on the interconnect into instrument memory for display or analysis by debuggers. Training operations allow link agents and trace tools to establish synchronization, i.e., knowledge of where they are in a bit stream, to enable proper interpretation of a received bit stream.

In order to effectively debug rarely occurring problems, logic analyzers must be able to operate for long periods of time (e.g., weeks) without getting lost with regard to what is happening on the link. Lost here is used to indicate a condition where the logic analyzer can not make sense of what is on the link. This occurs when the logic analyzer loses synchronization or "framing" due to bit slip or add (the receiver erroneously loses or adds a bit to the received data stream). The nature of capture of certain interconnects such as serial links that operate at high speeds is such that there is inherently a non-zero bit error rate (BER). While small (typically on the order of $10^{-12}$ or less), this error rate is still high enough such that over a sufficient amount of time, errors will occur. For example, for both directions of a 16 lane, 8 gigabits per second (Gbs) link, an error would occur approximately once every 4 seconds at a $10^{-12}$ BER (though errors that result in bit slip or add and cause loss of LA synchronization are expected to be much less frequent). These errors occur in both the link itself and in the trace tool capture of the bus independent of errors occurring on the link. Current methods of recovering from such errors can be ineffective.

DETAILED DESCRIPTION

In various embodiments, different techniques for resynchronization can be performed to enable resynchronization of trace tools, with or without link training, as well as to resynchronize components coupled via an interconnect without the need for link retraining. While the scope of the present invention is not limited in this regard, some embodiments may be used for performing resynchronization of devices (e.g., semiconductor devices) coupled via a serial link, such as a Peripheral Component Interconnect Express (PCI Express™ (PCIe™)) protocol in accordance with links based on the PCI Express™ Specification Base Specification version 2.0 (published Jan. 17, 2007) (hereafter the PCIe™ Specification), e.g., of a so-called PCIe™ N generation link (such as a PCIe™ Gen 3 link).

With respect to resynchronizations occurring due to loss of synchronization or framing by a logic analyzer, some embodiments may enable such resynchronization by causing a retraining on the link. Certain serial protocols such as PCIe™ Gen3 are designed such that if a receiver on a link receives an error and loses synchronization, the receiving agent detects the loss of framing and initiates link retraining by notifying the sending agent using in-band signaling over the return link. After retraining, the agents on the link will be synchronized with each other again. However, a typical logic analyzer is an "observer only" on a link, and does not have the same mechanisms available to it to cause a link retrain that are available to a link agent. Hence, once the logic analyzer loses framing, it will not be able to regain it unless link agents cause a retrain for other purposes, and tracing using the LA could not occur from that point on. Embodiments provide various techniques for the logic analyzer to regain synchronization by enabling retraining for this purpose.

Such retraining of a link may be forced either periodically or in response to an explicit indication by a link-monitoring logic analyzer that it has lost synchronization. To realize such synchronization, state machines controlling the link may accept input either from a timer or an external input (i.e., originating with the LA) in addition to normal conditions that cause retraining. Thus, a LA may include logic to generate and send an external signal, e.g., a "resynchronization" signal when it detects a loss of synchronization. As will be described, this output from the LA may be on a separate wire than the wires on which the LA receives data from a link. Note that the LA may be coupled to a link in different manners. As one example, a LA may be physically connected, e.g., via pads on a circuit board that in turn are connected to an interconnect to be tested, e.g., a link under test (LUT). In other implementations, the LA may be coupled via a slot interposer (e.g., a plug-in between a link expansion slot and a daughterboard of a system) through which the LUT communicates or via a probe head that connects along the LUT.

The external input from the LA to the agents coupled to the link can take many forms and the scope of the present invention is not limited in this regard. As some examples, the input may be via a dedicated pin, serial mechanism such as a system management bus (SMBus), Joint Test Action Group (JTAG), or any other 'out of band' mechanism by which a logic analyzer can communicate with a component containing a high speed serial link. In one embodiment, the external input can be incorporated as a type of hot-plug event and use the same mechanism as hot-plug inputs to an upstream component. The out of band mechanisms can cause all links on a component to retrain or optionally (and ideally) may indicate the specific link that requires retraining. Such indication may be a link-by-link indication, as a single component can have multiple links. Thus, instead of having a single input to indicate retraining of all links, some implementations may indicate the link to be retrained, therefore only retraining the link(s) where the attached LA is lost. Note that the logic analyzer may spend some period of time out of synchronization or "lost" prior to the retrain but such periods are presumed to be infrequent and are extremely unlikely to correspond with the time frame in which the bug occurs (which is the area of interest for trace capture).

In this way, embodiments provide for tracing of a serial link for long periods of time. Though a logic analysis tool may lose synchronization occasionally, adequately rapid re-synchronization can be realized such that when a condition of interest (e.g., a bug) eventually occurs on a link, the logic analyzer is able to capture the link contents.

Embodiments may be particularly suited to serial links that lack uniquely recognizable sequences from an encoding definition. That is, conventional encoded serial links (such as PCIe™ Gen1 and Gen2) can resynchronize based on uniquely recognizable sequences that are periodically transmitted on the link. Without using an embodiment of the present invention, once the LA loses synchronization on a link lacking such uniquely recognizable sequences, there is no way for the logic analyzer to regain synchronization and hence trace is lost from that point on.

Figure 1:
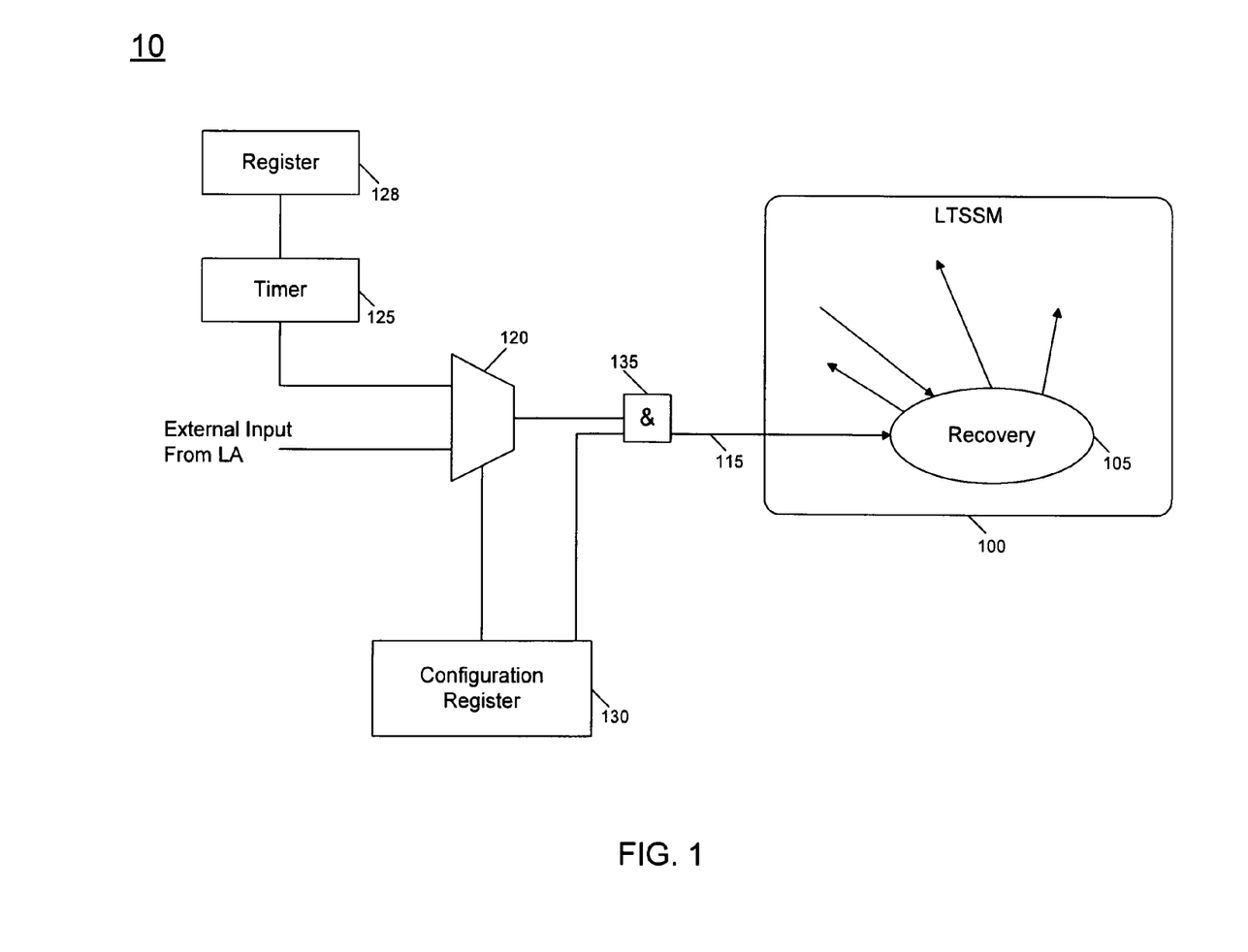
FIG. 1 is a block diagram of a recovery control circuit in accordance with one embodiment of the present invention.

Referring now to FIG. 1, shown is a block diagram of a recovery circuit 10 in accordance with one embodiment of the present invention that may be present in a physical layer of an interconnect such as a PCIe™ Gen3 interconnect. As seen, recovery circuit 10 includes a Link Training and Status State Machine (LTSSM) 100 that may be configured to receive an external input that allows entry into a recovery state (and subsequent link retrain) in response to either a timer expiration, or in response to an input from the logic analyzer.

As seen in FIG. 1, LTSSM 100 may be configured to receive various inputs. In response to these inputs the LTSSM 100 may cause a transition to a recovery state 105. In response to entering recovery state 105, a recovery mechanism may be performed, as well as a subsequent link retraining. In addition to other inputs, an external input via a signal line 115 may be provided to recovery state 105. Thus in addition to various conditions that can cause entry into recovery state 105, an external input via signal line 115 may also cause entry into recovery state 105.

Various circuitry, logic or so forth may enable generation of this signal to LTSSM 100. As one example implementation, shown in FIG. 1 recovery circuit 10 includes a multiplexer 120 that is coupled to receive an external input from a LA as well as an input from a timer 125. Based on control of multiplexer 120, which may be effected via a setting in a configuration register 130, multiplexer 120 may provide a selected one of the inputs to LTSSM 100. Note in the embodiment of FIG. 1, a logic 135, which may be an AND gate, may be coupled to receive the multiplexer output, and an enable signal, e.g., generated by an enable bit within configuration register 130. Thus, in addition to selection of external input or timer signal, the embodiment of FIG. 1 provides a user the ability to disable retraining responsive to external input or timer. For example, configuration register 130 may have two bits to control recovery circuit 10, namely a first bit to choose external input or timer (e.g., based on whether a LA is capable of generating a resynchronization signal) and a second bit to enable/disable this feature (i.e., by disabling, the periodic retraining may not occur). Other embodiments may handle such selections using a wider multiplexer or other mechanisms such as embedding whether to pay attention to the timer input directly into the state machine itself.

In one embodiment, timer 125 may count for a time period according to a value set forth in a register 128. Thus via a first bit of configuration register 130, the component is set up to respond either to the timer expiration or external input. When configured to retrain due to timer expiration, register 128 may select the timer period over a range of values. While the scope of the present invention is not limited in this regard, the time period at which recovery and retraining is to occur may vary within a wide range. Note that the recovery and retraining that is performed responsive to timer expiration is for the benefit of the attached logic analyzer, rather than being for the benefit of any agent coupled to the link itself, and as such the time period set for timer expiration may be controlled to provide for maximum benefit to a LA while minimally perturbing the link being observed. That is, because this resynchronization is for purposes of a LA that may be recording data over long periods (e.g., weeks), the timer may be set at intervals between a minute and an hour, for example, although the scope of the present invention is not limited in this regard.

As such, the LA can signal a loss of synchronization via the external input. Note that this external input from the LA may be via a separate channel, e.g., an out-of-band connection between the LA and the link under test. In some embodiments, a link may have a separate channel, e.g., a separate lane to which another pin or other connection of the LA may be coupled to provide this out-of-band communication.

Figure 2:
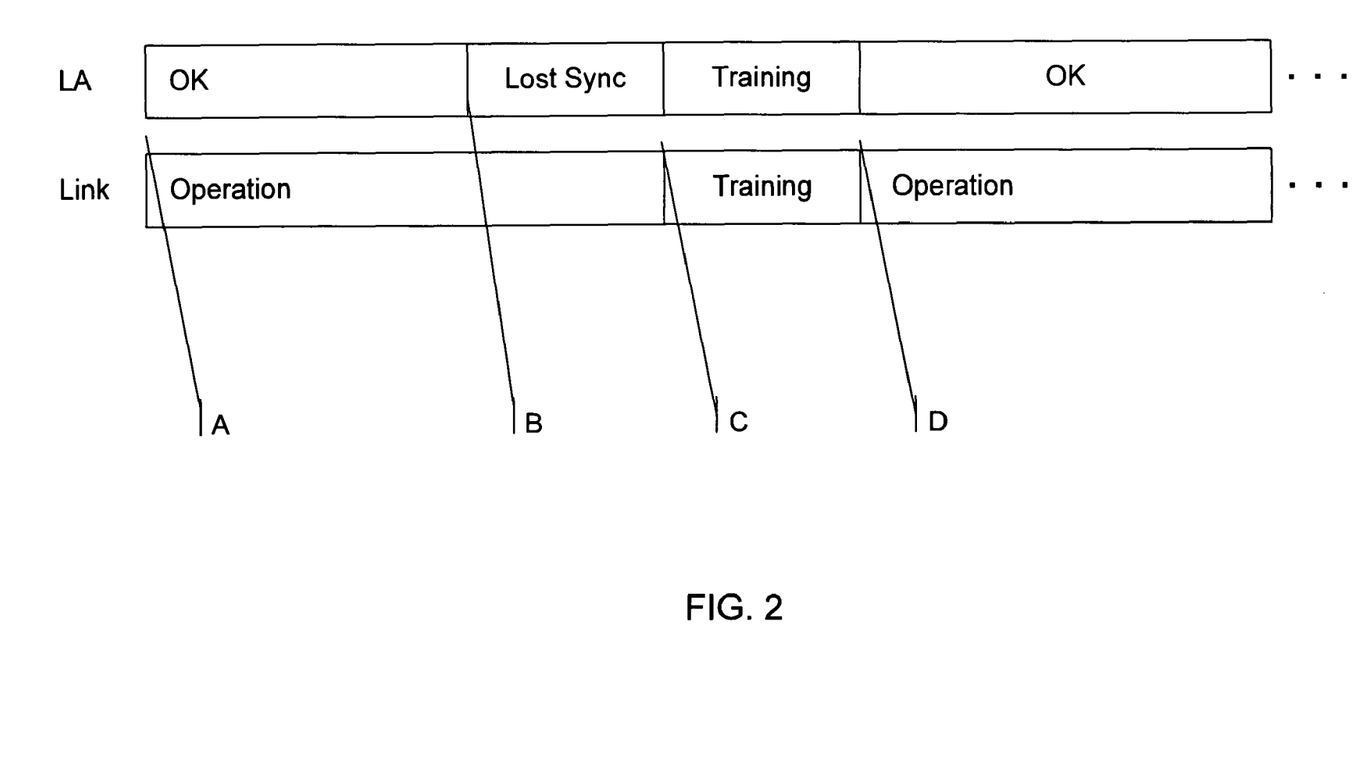
FIG. 2 is a timing diagram illustrating retraining of a link to allow resynchronization in accordance with one embodiment of the present invention.

FIG. 2 is a timing diagram (not to scale on time axis) that illustrates how retraining of a link allows the LA to resynchronize. At point A, the link is operational (transferring data) and the LA is capturing that data correctly due to having previously trained. At point B, however, the logic analyzer loses synchronization for some reason, and therefore can no longer make sense of the link data. At time C the link retrains, either in response to the timer or input from the logic analyzer, and at point D, at the end of training, both monitored link and LA are operational again.

Previous generations of PCIe (Gen1 and Gen2) are 8b10b encoded that provide adequate transitions for clock recovery. This encoding provides periodic ordered sets that start with a symbol that contains a uniquely identifiable bit pattern, a symbol known as COM. Thus trace tools can use this uniquely identifiable pattern to regain framing if lost. As such, links that provide this symbol are "self-healing" from the logic analyzer point of view because framing can be reestablished from the link bit stream itself. Reception of a COM additionally resets a link de-scrambling linear feedback shift register (LFSR) of a receiver's physical layer and in an attached logic analyzer receiver.

In contrast, other protocols such as PCIe Gen3 use link scrambling to provide adequate bit transitions for clock recovery (rather than 8b10b encoding). However, the encoding does not provide uniquely identifiable bit patterns that trace tools can use to regain framing; as such, the link is no longer "self-healing" from the point of view of a logic analysis tool. In such embodiments resynchronization of trace tools can be effected where the LA is a passive observer of a link.

Receiving agents in such protocols recover from errors or framing loss by initiating retraining of the link to overcome this limitation of the inability to re-acquire block lock after loss due to bit slip/add. After retraining, the agents on the link will be synchronized with each other again. In implementations in which a logic analyzer is an "observer only" on a link and does not have mechanisms available to it to cause a link retrain (that are available to a link agent), once the logic analyzer loses framing, it will not be able to regain it unless link agents cause a retrain for other purposes, and trace could not occur from that point on.

Thus another technique for a logic analyzer to regain synchronization is by having link transmitters periodically send an ordered set (referred to herein as Skip (SKP) Ordered Set or SOS) that enables resynchronization of bit recovery and lane alignment, and reloading of a de-scrambler linear feedback shift register (LFSR) value (resetting on each SOS is not desirable as it decreases the scrambler variability), and, optionally, identifies the start of the next packet on the link. Note that in some link protocols this same technique can be used by the receiver to reacquire its block lock instead of having to retrain the link. Note that such ordered sets may be sent on a predetermined periodic basis. As an example, such sets may be sent in the range of every millisecond or microsecond, or approximately every 16,000 blocks, in one embodiment. Embodiments may thus add a periodic transmission along the link that allows a logic analyzer to determine the framing boundaries with high confidence (followed by verification of the framing); update the value of the descrambling LFSRs; and identify the start of the next packet.

In one embodiment, this can be accomplished by link transmitters periodically inserting an unscrambled ordered set, i.e., a Skip Ordered Set (SOS), into the transmitted bit stream. The SOS can be sent on all lanes of a link simultaneously following a synchronization character that delimits the start of an encoding block. Various implementations may use a different set of predetermined data, e.g., one or more predetermined bit sequences, along with other information such as scrambler values. In one embodiment, each SOS is made up of the 10_ sync header (across all lanes); one or more SKP symbols (across all lanes); one SKP_END symbol (across all lanes); current transmitter LFSR value (per-lane value); and, optionally an offset to next packet header from lane 0 in double words (DW) (same on all lanes). However, in various embodiments, all pending packets may be transmitted before sending an unscrambled ordered set. Thus a current message in progress may be completed, logical idles inserted as needed to pad out to the end of the current block, and then a skip ordered set sent. As such the need for this offset as part of the SOS can be avoided.

The logic analyzer may be configured to reestablish framing by continuously searching for the first three items of the SOS, namely the sync header, SKP symbols and SKP_END symbol on all link lanes. The encoding of PCIe Gen3 or other link protocol is based on a scrambling approach rather than an 8b10b encoding, and the ordered sets do not contain any uniquely identifiable bit sequences that can not otherwise occur on the link. As such, it is possible (though extremely improbable) that payload bits in the data stream match a Skip Ordered Set. The logic analyzer therefore must perform a secondary verification that it has correctly framed after finding an SOS. In different implementations, this secondary verification could include checking for valid framing on the next several blocks, or verifying proper reception of a packet. That is, because normal communications along the link are scrambled, there is the possibility that any given piece of scrambled data will look the same as a skip ordered set; however the chance of any sequence of 130 bits across all lanes matching an SOS is not likely probabilistic. Thus a verification is performed using one or more of the following techniques: searching for a predetermined number of valid sync headers in succession, a predetermined number of valid data packets, or checking for the next skip Ordered Set. Thus the LA verifies the correct resynchronization because the link has a small possibility that scrambled data would end up looking like the skip ordered set.

As described above, PCIe Gen1/2 links reset their scramblers and descramblers when a COM is received. Scrambling-only encoding (e.g., of PCIe Gen3) makes it undesirable to reset the scrambler and descrambler LFSR following receipt of a SOS; instead the current transmitter scrambler LFSR value is transmitted as part of the SOS. The LA uses the LFSR values contained in the ordered set to set its lane descrambler LFSRs to match the link transmitter.

Finally, in some implementations the Skip Ordered Set contains an offset (e.g., in double words) to the start of the full packet from lane 0 of the next block. This information may aid the logic analyzer in finding the start of the next packet. That is, the block following the SOS may start in the middle of an existing packet, in which case the LA will have missed the start of the packet that contained the packet length used to determine packet boundaries. Following an SOS, this offset can be used to find the next packet instead of using knowledge of the length of the current packet. However, in a PCIe Gen3 implementation, such offset is not needed as an SOS is not allowed to start in the middle of a packet. Rather, the next message starts in the block following the SOS.

Without using an embodiment with periodic ordered set transmission, when a passive LA (i.e., lacking a mechanism to inform the link agents of loss of synchronization) loses synchronization, there is no way to for the logic analyzer to regain synchronization and hence trace is lost from that point on. Note that in some link protocols this same technique can be used by a receiver to reacquire block lock without having to go through link reinitialization.

Table 1 below illustrates one possible format for an SOS inserted into a bitstream. The example shows a case where two SKP symbols are inserted per lane (as mentioned above the number of inserted SKP symbols can vary). The SKP and SKP_END symbols are followed by the LFSR value for each lane, and finally all lanes carry the OFFSET from lane 0 of the next block to the start of the next packet in DW. For the example provided, the OFFSET value would be 3. Note that this same OFFSET value is present across all lanes.

TABLE 1

|  | Lane 0 | Lane 1 | Lane 2 | Lane 3 | Lane 4 |
|---|---|---|---|---|---|
| Sync | 0 | 0 | 0 | 0 | 0 |
|  | 1 | 1 | 1 | 1 | 1 |
| Byte 0 | Start TLP ← (1111) | Len TLB + CRC | →\|← | Seq No → | ←TLP Header (DW 0) |
| Byte 1 | ←— | — | — | —TLP Header | (DW 1 and 2)— |
| Byte 2 | ←— | —TLP Header | (DW 3)— | —→ | ←— |
| Byte 3 | ←— | LCRC (1 DW) | — | —→ | Start DLP (00001111) |
| Byte 4 | DLP | Payload → | ←—LC | RC —→ | SKP/LIDL (00000000) |
| Byte 5 | Logical IDL (00000000) | Logical IDL (00000000) | Logical IDL (00000000) | Logical IDL (00000000) | Logical IDL (00000000) |
| Byte 6 | Start TLP ← (1111) | Len TLB + CRC | →\|← | Seq No → | ←TLP Header (DW 0) |
| Byte 15 | ←— | TLP Data (DW 14) | — | —→ | ←— |
| Sync | 1 | 1 | 1 | 1 | 1 |
|  | 0 | 0 | 0 | 0 | 0 |

TABLE 1-continued

|  | | | | | |
|---|---|---|---|---|---|
|  | SKP | SKP | SKP | SKP | SKP |
|  | SKP | SKP | SKP | SKP | SKP |
|  | SKP_END | SKP_END | SKP_END | SKP_END | SKP_END |
|  | Lane 0 LFSR | Lane 1 LFSR | Lane 2 LFSR | Lane 3 LFSR | Lane 4 LFSR |
|  | Lane 0 LFSR | Lane 1 LFSR | Lane 2 LFSR | Lane 3 LFSR | Lane 4 LFSR |
|  | Lane 0 LFSR Offset | Lane 1 LFSR Offset | Lane 2 LFSR Offset | Lane 3 LFSR Offset | Lane 4 LFSR Offset |
|  | Offset | Offset | Offset | Offset | Offset |
| Sync | 0 | 0 | 0 | 0 | 0 |
|  | 1 | 1 | 1 | 1 | 1 |
| Byte 0 | ← | TLP Data (DW 19) |  |  |  |
| Byte 1 | ← | LCRC (1 DW) |  |  |  |
| Byte 2 | Start TLP ← (1111) | Len TLP + CRC | →\|← | Seq No → | ←TLP Header (DW 0) |

|  | Lane 5 | Lane 6 | Lane 7 | | |
|---|---|---|---|---|---|
| Sync | 0 | 0 | 0 | | |
|  | 1 | 1 | 1 | | |
| Byte 0 | (DW 0) — | — | —→ | | |
| Byte 1 | — | — | —→ | ← | TLP |
| Byte 2 | Data (1 DW) | — | —→ | | |
| Byte 3 |  | ← DLP Pay | Load ← | ← | DLLP |
| Byte 4 | SKP/LIDL (00000000) | SKP/LIDL (00000000) | SKP/LIDL (00000000) | | |
| Byte 5 | Logical IDL (00000000) | Logical IDL (00000000) | Logical IDL (00000000) | | |
| Byte 6 | (DW 0) — | — | —→ | ← | TLP |
| Byte 15 | TLP Data (DW 15) | — | —→ | | |
| Sync | 1 | 1 | 1 | | |
|  | 0 | 0 | 0 | | |
|  | SKP | SKP | SKP | ← | SOS |
|  | SKP | SKP | SKP | | |
|  | SKP_END | SKP_END | SKP_END | | |
|  | Lane 5 LFSR | Lane 6 LFSR | Lane 7 LFSR | | |
|  | Lane 5 LFSR | Lane 6 LFSR | Lane 7 LFSR | | |
|  | Lane 5 LFSR Offset | Lane 6 LFSR Offset | Lane 7 LFSR Offset | | |
|  | Offset | Offset | Offset | ← | SOS |
| Sync | 0 | 0 | 0 | | |
|  | 1 | 1 | 1 | | |
| Byte 0 | TLP Data (DW 17) | — | —→ | ← | Remainder of TLP |
| Byte 1 | SKP/LIDL (00000000) | SKP/LIDL (00000000) | SKP/LIDL (00000000) | | |
| Byte 2 | (DW 0) — | — | —→ | Time | |

Start of next TLP. OFFSET value is number of DW Between lane 0, byte 0 and here.

Referring now to Table 2, shown is an example of a PCIe Gen3 SOS. Bytes 4-10 are all SKP bytes that in turn are followed by the lane's LFSR values, and finally the SKP_END symbol. This illustrates a special case of where an offset is not needed because the protocol does not allow insertion of the SOS into a message, i.e., the SOS can only begin on a block boundary.

TABLE 2

|  | End of previous block | | | | | | |
|---|---|---|---|---|---|---|---|
| Byte 15 | | | | | | | |
| Sync | 1 | 1 | 1 | 1 | 1 | 1 | 1 |
| Char | 0 | 0 | 0 | 0 | 0 | 0 | 0 |
| Byte 0 | SKP | SKP | SKP | SKP | SKP | ... SKP | SKP |
| Byte 1 | SKP | SKP | SKP | SKP | SKP | SKP | SKP |
| Byte 2 | SKP | SKP | SKP | SKP | SKP | SKP | SKP |
| Byte 3 | SKP | SKP | SKP | SKP | SKP | SKP | SKP |
|  |  |  |  | ... |  |  |  |
| Byte 11 | SKP | SKP | SKP | SKP | SKP | SKP | SKP |
| Byte 12 | Lane 0 LFSR | Lane 1 LFSR | Lane 2 LFSR | Lane 3 LFSR | Lane 4 LFSR | Lane 14 LFSR | Lane 15 LFSR |
| Byte 13 | Lane 0 LFSR | Lane 1 LFSR | Lane 2 LFSR | Lane 3 LFSR | Lane 4 LFSR | Lane 14 LFSR | Lane 15 LFSR |
| Byte 14 | Lane 0 LFSR | Lane 1 LFSR | Lane 2 LFSR | Lane 3 LFSR | Lane 4 LFSR | Lane 14 LFSR | Lane 15 LFSR |
| Byte 15 | SKP_END | SKP_END | SKP_END | SKP_END | SKP_END | SKP_END | SKP_END |

TABLE 2-continued

| Sync Char Byte 0 | 0 1 | 0 1 | 0 1 | 0 1 | 0 1 | 0 1 | 0 1 |
|---|---|---|---|---|---|---|---|
| | Start of next block | | | | | | |

Figure 3:
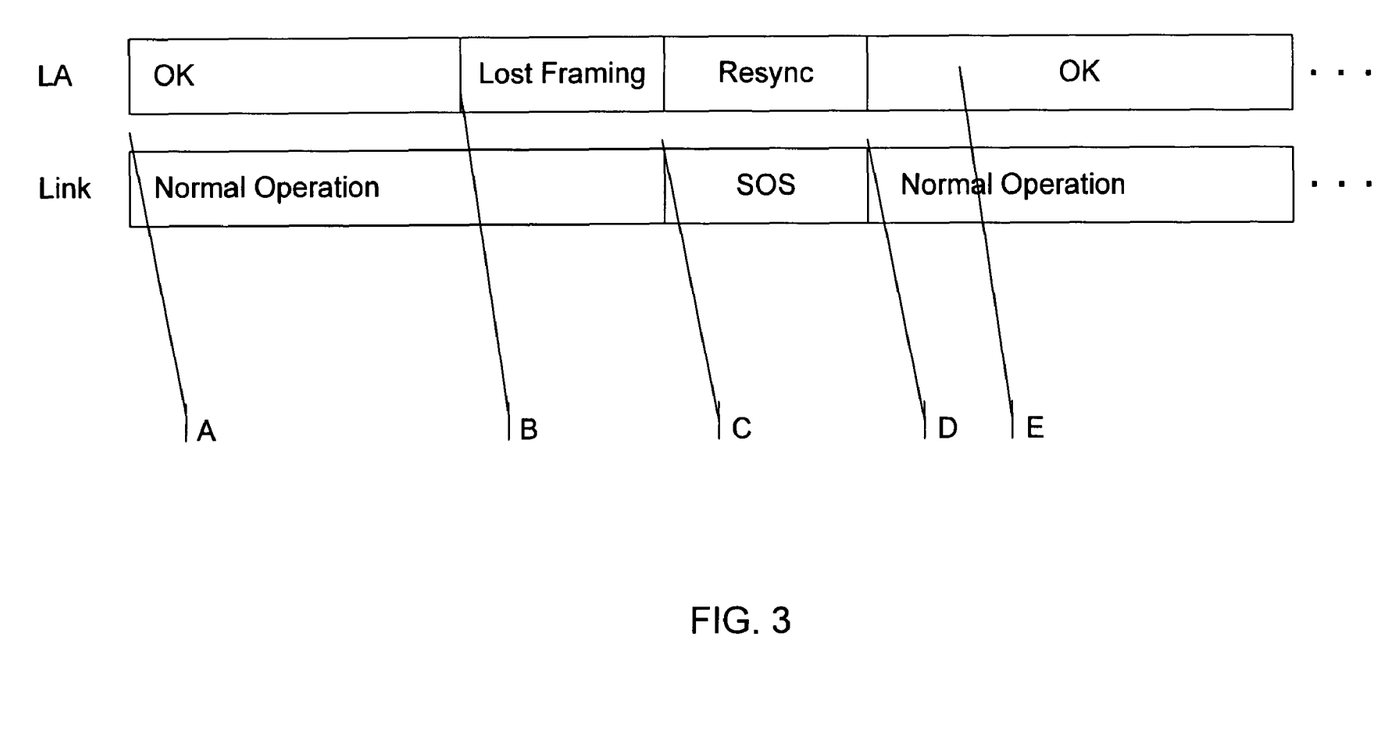
FIG. 3 is a timing diagram illustrating implementation of a skip ordered set to allow resynchronization in accordance with another embodiment of the present invention.

FIG. 3 is a timing diagram (not to scale on time axis) that illustrates how the Skip Ordered Set allows the LA (or a lost receiver that does not want to retrain) to resynchronize. At point A, the link is operational (transferring data) and the LA is capturing that data correctly. At point B the logic analyzer loses synchronization for some reason, and therefore can no longer make sense of the link data. Accordingly, the LA starts searching for SOS across all lanes in the stream after recognizing that it has lost framing. At time C an SOS is inserted into the stream, the LA recognizes the SOS in the stream and reloads its lane descrambler LSFR values. Between times D and E the LA is waiting the number of double words indicated in the OFFSET parameter of the SOS. At time E, the LA reached the start of the next packet and can start looking at packets again and may next validate the resynchronization point by looking at a predetermined number of valid sync headers in succession, a predetermined number of valid packets and/or subsequent skip ordered sets. When used by a receiver to avoid a link retrain, the receiver may drop accepting subsequent packets until it reacquires its block lock to avoid data corruption due to aliasing.

Though a logic analysis tool may still lose synchronization occasionally, embodiments allow it to regain synchronization such that when then the conditions of interest eventually occur on a link, the logic analyzer is able to capture the contents of the link. Bugs often take long periods of time to manifest. As such, logic analysis tools must be able to reliably capture the activity on the bus during these periods. The LA may lose track for small time periods during the entire run period, but can quickly regain synchronization such that the vast majority of the time it is able to remain in synchronization and reliably capture the link behavior. Embodiments may also benefit components of a link that require a long time to retrain to be able to just re-acquire their block lock using the same methodology.

Figure 4:
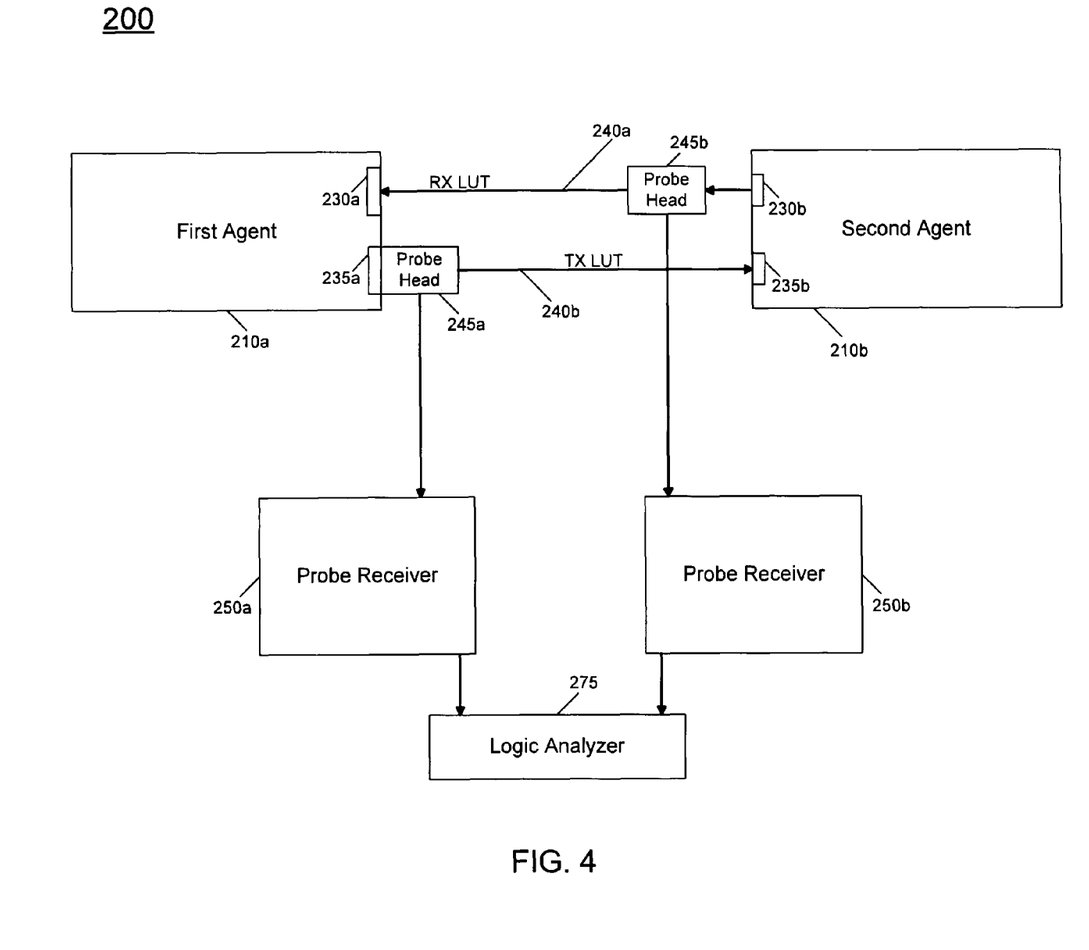
FIG. 4 is a block diagram of a portion of a system with trace tools on links under test in accordance with one embodiment of the present invention.

Referring now to FIG. 4, shown is a block diagram of a portion of a system in accordance with one embodiment of the present invention. As shown in FIG. 4, system 200 includes multiple agents, namely a first agent 210a and a second agent 210b (generically agent 210). In the embodiment of FIG. 4, first agent 210a may be a processor such as a central processing unit (CPU), while second agent 210b may be another processor, a chipset or some other component, although the scope of the present invention is not limited in this regard.

First agent 210a may include, for example, ports 230a and 235a, each of which may be coupled to a respective link under test (LUT), namely a receive (RX) LUT 240a and a transmit (TX) LUT 240b (generically LUT 240). In various embodiments, LUTs 240 may be conductive traces of a circuit board such as a motherboard having a serial-based point-to-point interconnect protocol such as a PCIe™ link, or other such link. To enable testing, probe heads 245a and 245b may be coupled to LUTs 240. Such probe heads may be of many different types such as direct tap, electromagnetic coupling (EMC), optical or other probes to sense signals and send them to probe receivers 250a and 250b (generically probe receiver 250) using probe channels that may be implemented using printed circuit board (PCB), flex cables, micro-coaxial cables or other ways.

To confirm the accuracy of probed data and correct any errors that may be present, probe heads 245a and 245b may be coupled to probe receivers 250a and 250b. Such probe receivers, which may be an ASIC, circuit board or other logic, may include circuitry to receive the information from these sources and perform alignment operations, as well as error detection/correction. In various embodiments, probe receiver 250 may implement a full link layer such as that of the communication protocol of LUT 240. In some embodiments, probe receivers 250 transmit the recovered data to a LA 275 or other validation device. While LA 275 is shown as being indirectly coupled to LUT 240, the scope of the present invention is not limited in this regard and other means of obtaining data from the LUT can be realized. For example, in other embodiments, the information from LUT 210 may be coupled to LA 275 via direct connection.

Figure 5:
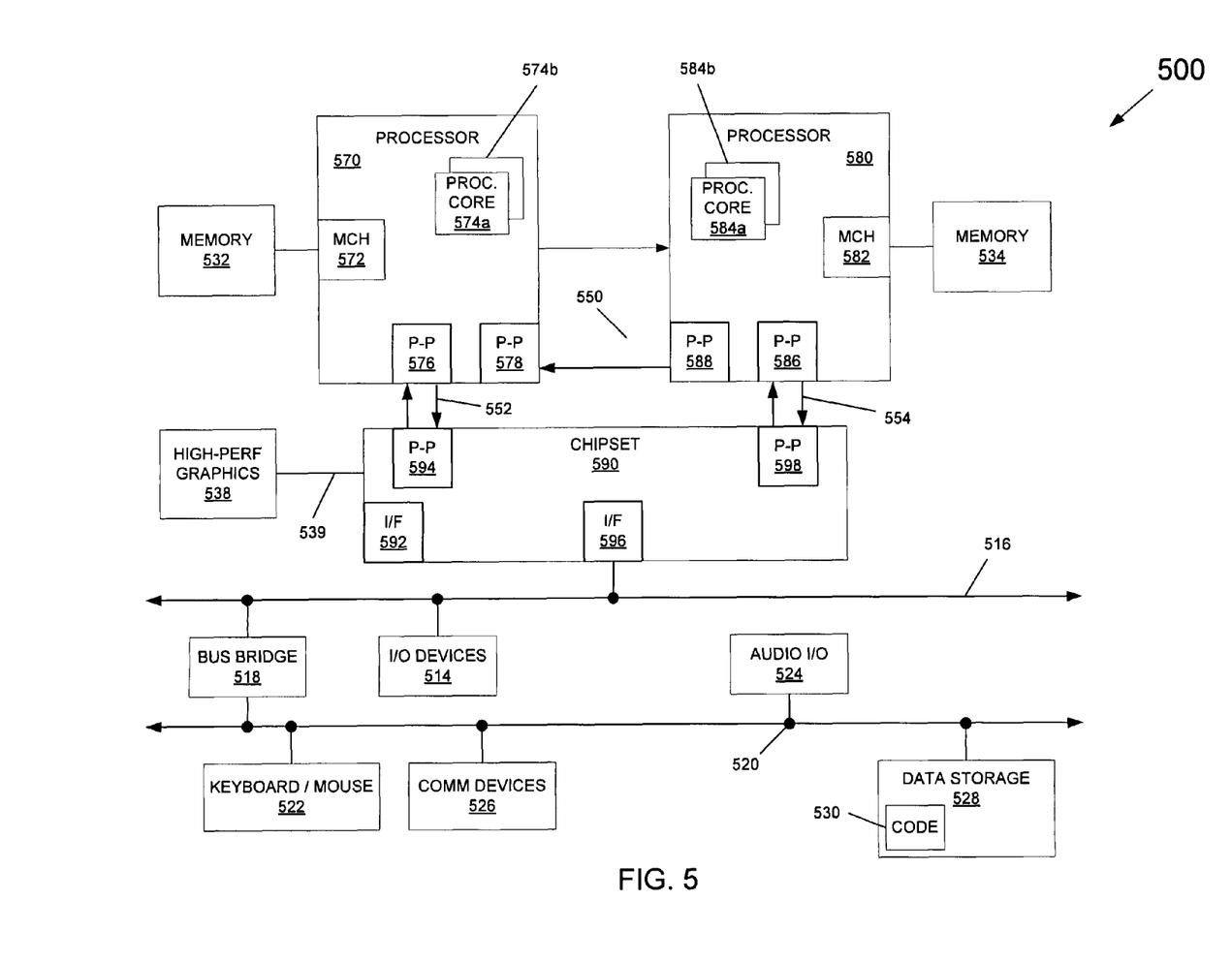
FIG. 5 is a block diagram of a system in accordance with an embodiment of the present invention.

Embodiments may be used to probe many different system types. Referring now to FIG. 5, shown is a block diagram of a system in accordance with an embodiment of the present invention. As shown in FIG. 5, multiprocessor system 500 is a point-to-point interconnect system, and includes a first processor 570 and a second processor 580 coupled via a point-to-point interconnect 550. As shown in FIG. 5, each of processors 570 and 580 may be multicore processors, including first and second processor cores (i.e., processor cores 574a and 574b and processor cores 584a and 584b). As one example, interconnect 550 may be probed via a connection to a LA in accordance with an embodiment of the present invention. Note that other architectures are possible. For example, instead of the point-to-point architecture of FIG. 5, a system may implement a multi-drop bus or another such architecture. Any of the transmitting agents of FIG. 5 may communicate according to a protocol that provides for periodic transmission of an unscrambled ordered set, and/or enables retraining to occur responsive to a timer mechanism or upon receipt of an indication of a loss of synchronization by an attached LA.

Still referring to FIG. 5, first processor 570 further includes a memory controller hub (MCH) 572 and point-to-point (P-P) interfaces 576 and 578. Similarly, second processor 580 includes a MCH 582 and P-P interfaces 586 and 588. As shown in FIG. 5, MCH's 572 and 582 couple the processors to respective memories, namely a memory 532 and a memory 534, which may be portions of main memory (e.g., a dynamic random access memory (DRAM)) locally attached to the respective processors. First processor 570 and second processor 580 may be coupled to a chipset 590 via P-P interconnects 552 and 554, respectively, although in other embodiments the need for a chipset can be avoided. As shown in FIG. 5, chipset 590 includes P-P interfaces 594 and 598.

Furthermore, chipset 590 includes an interface 592 to couple chipset 590 with a high performance graphics engine 538 via a P-P interconnect 539. In turn, chipset 590 may be coupled to a first bus 516 via an interface 596. As shown in FIG. 5, various I/O devices 514 may be coupled to first bus 516, along with a bus bridge 518 which couples first bus 516 to a second bus 520. Various devices may be coupled to second bus 520 including, for example, a keyboard/mouse 522, communication devices 526 and a data storage unit 528 such as a disk drive or other mass storage device which may include code 530, in one embodiment. Further, an audio I/O 524 may be coupled to second bus 520.

Figure 6:
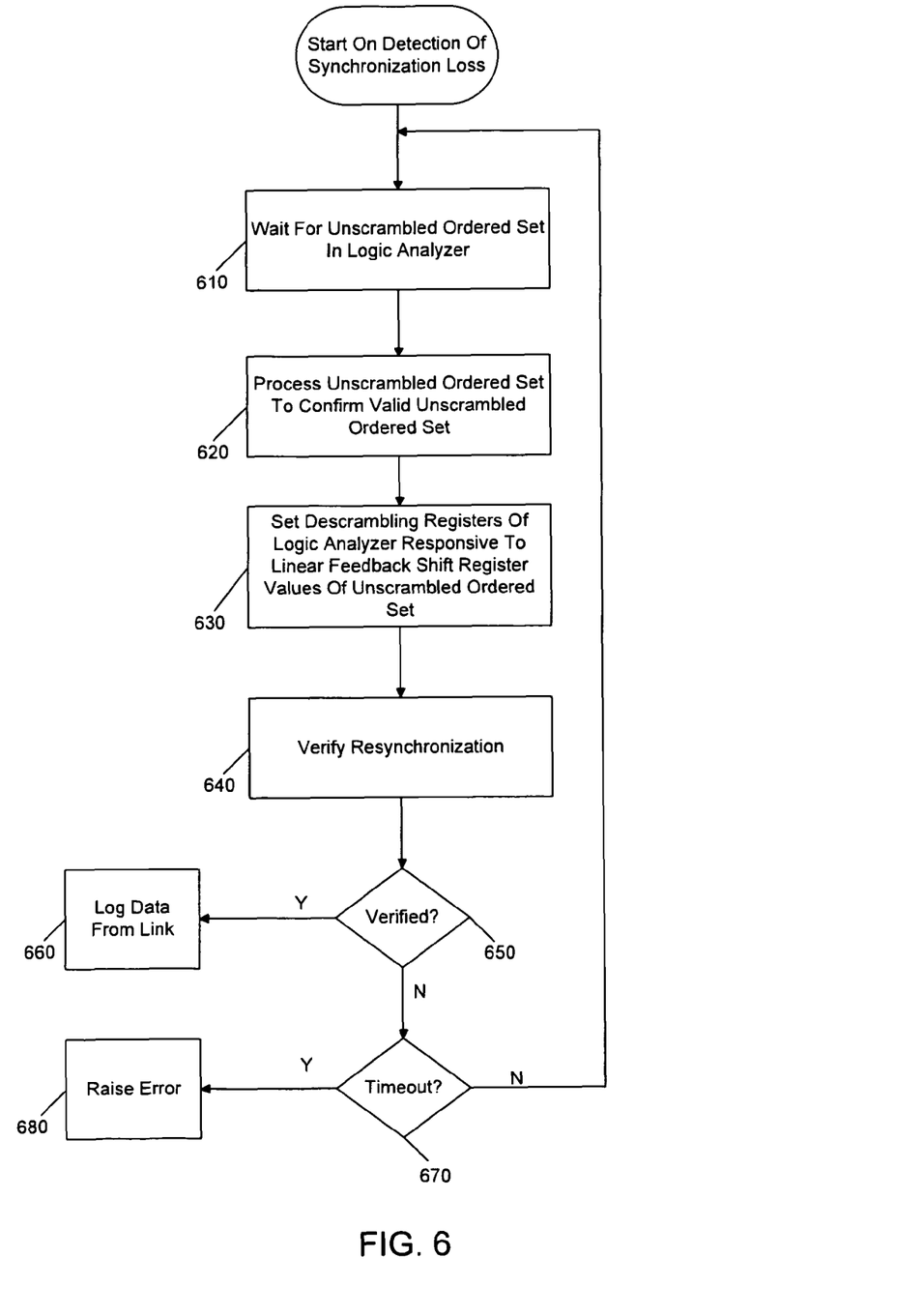
FIG. 6 is a flow diagram of a method in accordance with an embodiment of the present invention.

Referring now to FIG. 6, shown is a flow diagram of a method in accordance with an embodiment of the present invention. As shown in FIG. 6, method 600 may be implemented by a logic analyzer to handle resynchronization using information obtained from a link. Note that the method of FIG. 6 may not be implemented until a LA has recognized that it is lost, as the LA would not necessarily begin looking for the SOS until such time. In other words, the LA can receive SOSs but not use them (i.e., for resynchronization) until lost, and instead just capture and save them to memory as with any other received block.

Method 600 may begin on determination of a loss of synchronization. As seen, the method then waits for an unscrambled skip ordered set in the logic analyzer (block 610). This skip ordered set may be such as that described above with regard to Table 1, Table 2, or another such set. At block 620, the logic analyzer processes this skip ordered set to confirm that it is a valid ordered set. For example, the logic analyzer may check for the various information fields, namely synchronization header, first and second predetermined bit sequences, and a LFSR value for each lane.

Referring still to FIG. 6, next at block 630, one or more descrambling registers of the logic analyzer may be set responsive to the LFSR value passed in the skip ordered set to resynchronize the logic analyzer with communications along the link. Then at block 640 resynchronization may be verified. For example, verification may occur by counting a number of valid synchronization headers that are associated with incoming blocks. If verification is successful (as determined at diamond 650), the logic analyzer may begin or resume logging data received from the link (block 660). Otherwise, if a timeout has not occurred (diamond 670) the logic analyzer returns to searching for the ordered set across all lanes. Note in some implementations, the LA may raise an error if it is unable to resynchronize within a specified amount of time (block 680). While shown with this particular implementation in the embodiment of FIG. 6, the scope of the present invention is not so limited in this regard.

Embodiments may be implemented in code and may be stored on a storage medium having stored thereon instructions which can be used to program a system to perform the instructions. The storage medium may include, but is not limited to, any type of disk including floppy disks, optical disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a first semiconductor device including a physical layer to enable communication along a link coupled between the first semiconductor device and a second device, the physical layer including a state machine to enable retraining of the link, wherein the state machine is to be initiated responsive to an external input received from a logic analyzer coupled to the link, the external input to indicate that the logic analyzer has lost synchronization with respect to link communications and the retraining is to enable the logic analyzer to regain the synchronization.

2. The apparatus of claim 1, further comprising a recovery circuit including a multiplexer to select either the external input or a timer signal, wherein the timer signal is generated responsive to expiration of a timer coupled to the multiplexer.

3. The apparatus of claim 2, further comprising a configuration register coupled to the multiplexer including a first selection indicator to be provided to the multiplexer to select the external input or the timer signal for output.

4. The apparatus of claim 3, further comprising a logic coupled to the multiplexer to receive the multiplexer output and to pass the multiplexer output to the state machine responsive to a second selection indicator of the configuration register.

5. The apparatus of claim 3, wherein the multiplexer is to select the external input if the logic analyzer is capable of transmission of the external input and to otherwise select the timing signal, responsive to the first selection indicator.

6. The apparatus of claim 1, wherein the link communications do not include a periodic uniquely recognizable sequence.

7. The apparatus of claim 1, wherein the physical layer is to receive the external input from an out-of-band channel coupled to the first semiconductor device, wherein the external input is to indicate a link of a plurality of links coupled to the first semiconductor device that is to be retrained.

8. An apparatus comprising:
a transmitter coupled to a link on which communications proceed according to a scrambling protocol which lacks a periodic uniquely recognizable sequence, the link coupled between the transmitter and a receiver, the transmitter including a physical layer to periodically send an unscrambled ordered set along the link to enable a logic analyzer coupled to the link to regain synchronization with respect to the communications, wherein the unscrambled ordered set includes a synchronization header, a first predetermined bit sequence, a second predetermined bit sequence and a value from a scrambling register of the transmitter.

9. The apparatus of claim 8, wherein the unscrambled ordered set is sent at a predetermined rate.

10. The apparatus of claim 8, wherein the logic analyzer is to regain the synchronization using the unscrambled ordered set and to perform a verification of the resynchronization thereafter.

11. The apparatus of claim 10, wherein the logic analyzer is to perform the verification by counting a predetermined number of synchronization headers, each associated with a block of the communications.

12. The apparatus of claim 8, wherein the logic analyzer is to reset a de-scrambling register of the logic analyzer responsive to the value of the unordered scrambled set.

13. The apparatus of claim 8, wherein the unordered scrambled set includes an offset value to indicate a distance from an end of the unscrambled ordered set to a beginning of a following packet header.

14. The apparatus of claim 8, wherein the transmitter is to transmit the unscrambled ordered set simultaneously on a plurality of lanes forming the link, wherein the first and second predetermined bit sequences are common across the plurality of lanes and the value is a per-lane value.

15. A method comprising:
receiving an unscrambled ordered set in a logic analyzer coupled to a link, the unscrambled ordered set generated and transmitted by a transmitting agent at a periodic interval, wherein communications proceed along the link according to a scrambling protocol which lacks a periodic uniquely recognizable sequence;
processing the unscrambled ordered set to confirm a valid unscrambled ordered set;
setting one or more de-scrambling registers of the logic analyzer responsive to a scrambling register value passed in the unscrambled ordered set to resynchronize the logic analyzer to the communications; and
verifying resynchronization of the logic analyzer.

16. The method of claim 15, further comprising receiving the unscrambled ordered set including a synchronization header, a first predetermined symbol, a second predetermined symbol and the scrambling register value.

17. The method of claim 16, further comprising receiving the unscrambled ordered set simultaneously on a plurality of lanes forming the link, wherein the first and second predetermined symbols are common across the plurality of lanes and the scrambling register value is a per-lane value.

18. The method of claim 15, further comprising performing the verification by counting a predetermined number of subsequent synchronization headers, each associated with a block of the communications.

19. The method of claim 15, further comprising performing the verification by counting a predetermined number of valid data packets or checking for a following unscrambled ordered set.

20. The method of claim 15, further comprising logging data from the link in the logic analyzer if the resynchronization has been verified.

* * * * *